(12) United States Patent
Ignomirello

(10) Patent No.: US 9,603,251 B1
(45) Date of Patent: Mar. 21, 2017

(54) APPARATUS AND METHOD OF MIDPLANE PANEL CONNECTIONS

(71) Applicant: Symbolic IO Corporation, Holmdel, NJ (US)

(72) Inventor: Brian M. Ignomirello, Holmdel, NJ (US)

(73) Assignee: SYMBOLIC IO CORPORATION, Holmdel, NJ (US)

( * ) Notice: Subject to any disclaimer, the term of this patent is extended or adjusted under 35 U.S.C. 154(b) by 0 days.

(21) Appl. No.: 15/089,053

(22) Filed: Apr. 1, 2016

Related U.S. Application Data

(60) Provisional application No. 62/305,686, filed on Mar. 9, 2016.

(51) Int. Cl.
*H05K 7/14* (2006.01)
*H05K 7/18* (2006.01)
*H05K 1/18* (2006.01)
*H05K 3/36* (2006.01)
*H05K 7/20* (2006.01)
*H05K 5/00* (2006.01)

(52) U.S. Cl.
CPC .............. *H05K 1/18* (2013.01); *H05K 3/368* (2013.01); *H05K 5/0017* (2013.01); *H05K 7/20909* (2013.01)

(58) Field of Classification Search
USPC ........................................ 361/800, 796, 816
See application file for complete search history.

(56) References Cited

U.S. PATENT DOCUMENTS

| | | |
|---|---|---|
| 6,785,133 B2 | 8/2004 | Barringer et al. |
| 7,145,776 B2 | 12/2006 | King, Jr. et al. |
| 7,164,581 B2 | 1/2007 | Carullo et al. |
| 7,516,272 B2 | 4/2009 | Felton et al. |
| 7,539,026 B2 | 5/2009 | Finnerty et al. |
| 7,925,389 B2 | 4/2011 | Bradicich et al. |
| 8,006,108 B2 | 8/2011 | Brey et al. |
| 8,366,464 B1 | 2/2013 | Figuerado et al. |
| 8,508,928 B2 | 8/2013 | Killen et al. |
| 8,547,825 B2 | 10/2013 | Armstrong et al. |
| 9,106,020 B2 | 8/2015 | Cohen et al. |

(Continued)

FOREIGN PATENT DOCUMENTS

| | | |
|---|---|---|
| CN | 102611560 A | 7/2012 |
| WO | 2006042041 A2 | 4/2006 |

OTHER PUBLICATIONS

Hewlett Packard (HP), "Best Practices for HP BladeSystem Deployments using HP Serviceguard Solutions for HP-UX 11i", HP Publication No. 5697-0470, May 2010, pp. 1-26.

Primary Examiner — Andargie M Aychillhum
(74) Attorney, Agent, or Firm — Maldjian Law Group LLC

(57) ABSTRACT

A connector board for an electronic assembly, the connector board including a passive circuit board, mounted horizontally at an elevated position within the electronic assembly, a voltage distribution plane formed as a layer of the passive circuit board, a first electrical interface coupled to the voltage distribution plane, the first electrical interface used to supply a predetermined voltage to the voltage distribution plane, and a second electrical interface coupled to the voltage distribution plane, the second electrical interface used to draw the predetermined voltage from the voltage distribution plane.

13 Claims, 6 Drawing Sheets

(56) References Cited

U.S. PATENT DOCUMENTS

| | | | |
|---|---|---|---|
| 2004/0262409 A1 | 12/2004 | Crippen et al. | |
| 2005/0091440 A1 | 4/2005 | Isa et al. | |
| 2006/0174140 A1* | 8/2006 | Harris .................... | G11C 5/04 713/300 |
| 2010/0245665 A1 | 9/2010 | Chrnega et al. | |
| 2012/0209448 A1* | 8/2012 | Brower ................. | G06F 1/206 700/299 |
| 2013/0268812 A1* | 10/2013 | Liu ....................... | G05B 13/02 714/57 |
| 2016/0043484 A1 | 2/2016 | Brodsky et al. | |

* cited by examiner

100

APPARATUS AND METHOD OF MIDPLANE PANEL CONNECTIONS

CROSS-REFERENCE TO RELATED APPLICATIONS

This application claims the benefit of U.S. Provisional Patent Application Ser. No. 62/305,686, filed on Mar. 9, 2016, the entire content of which is hereby incorporated by reference in its entirety.

BACKGROUND

Field

Embodiments of the present disclosure generally relate to electrical interconnections internal to an electronic assembly, and, in particular, to an apparatus and method to reduce an internal volume and quantity of electrical interconnections.

Description of Related Art

Electronic equipment or assemblies such as computer servers, routers, bridges, switches, gateways, specialized instrumentation (e.g., signal generators and signal monitors), etc., are often mounted in a standard-dimension rack within an equipment room or laboratory. Width of a standard rack is ordinarily 19", with 23" wide racks sometimes used for legacy equipment. Height of a full-size rack is about 6 feet. Each rack is divided into a plurality of shelf locations of uniform vertical separation from an adjacent shelf location, the separation being 1.75" and referred to as one rack unit or "1 U". A full-size rack is 42 U, i.e., forty-two possible shelf locations. An article of equipment may occupy an integer number of contiguous shelf locations, e.g., 1 U, 2 U, 3 U, etc. The article of equipment may be installed horizontally to occupy the entire width of the rack for the shelf location(s) it occupies, but half-width configurations are also available. Alternatively, smaller articles of equipment may be installed as vertically-mounted cards in a sub-shelf, the sub-shelf itself taking up an integer number of rack units.

Common or high-volume production electronic assemblies may be highly integrated within a shelf unit, e.g., by use of a single main circuit board (e.g., a motherboard) that compactly integrates most components onto the single main circuit board, including interconnection wiring.

However, some electronic assemblies (e.g., those for low-volume or specialized purposes) may include a relatively large number of discrete subsystems (i.e., components too large to be integrated onto a single main circuit board). Examples of assemblies may include disk drives, high-capacitance capacitor arrays, internal peripherals such as fans, and so forth. In some designs it may also be desirable to make the number of discrete subsystems be field-expandable, e.g., expandable by an end-user after manufacture. Designs may entail a large number of discrete interconnection wiring, e.g., discrete wiring cables, bundles or ribbons for data signals, clock signals, control signals, feedback signals, various direct current (DC) voltage levels of various amperage requirements, and electrical ground. The interconnection wiring is discrete in the sense that the wiring is not incorporated into a circuit board as traces.

A drawback of the known art is that a large number of discrete interconnection wiring may take up a significant portion of the internal volume of the electronic equipment, thus causing secondary problems such as blocking airflow and causing increased service times when adding, removing, or reconfiguring the discrete interconnection wiring. There also may be increased risk of dislodging or damaging a cable during servicing. Furthermore, there is always a desire to make electronic equipment smaller or to include additional functionality, which may further exasperate problems caused by stuffing a large (or larger) number of discrete interconnection wiring into a small (or smaller) physical volume. As the electronic equipment includes more subsystems generating more heat, airflow may be further blocked by discrete wiring dedicated to the more heat-generating subsystems.

Therefore, a more space-efficient discrete interconnection wiring is needed, while maintaining the advantages of electronic assemblies with discrete subsystems.

BRIEF SUMMARY

In one embodiment, a mid-plane conductor board is installable in an electronic assembly to provide signal distribution. In some embodiments, the mid-plane conductor board may include no active components (i.e., only signal distribution, ground plane, and/or voltage distribution planes). In other embodiments, the mid-plane conductor board may include no active components except for status indications related to signal distribution or voltage distribution.

In one embodiment, a method provides signal distribution via a midplane conductor board in an electronic assembly.

The preceding is a simplified summary of embodiments of the disclosure to provide an understanding of some aspects of the disclosure. This summary is neither an extensive nor exhaustive overview of the disclosure and its various embodiments. It is intended neither to identify key or critical elements of the disclosure nor to delineate the scope of the disclosure but to present selected concepts of the disclosure in a simplified form as an introduction to the more detailed description presented below. As will be appreciated, other embodiments of the disclosure are possible utilizing, alone or in combination, one or more of the features set forth above or described in detail below.

BRIEF DESCRIPTION OF THE DRAWINGS

The above and still further features and advantages of the present disclosure will become apparent upon consideration of the following detailed description of embodiments thereof, especially when taken in conjunction with the accompanying drawings wherein like reference numerals in the various figures are utilized to designate like components, and wherein.

Figure 1:
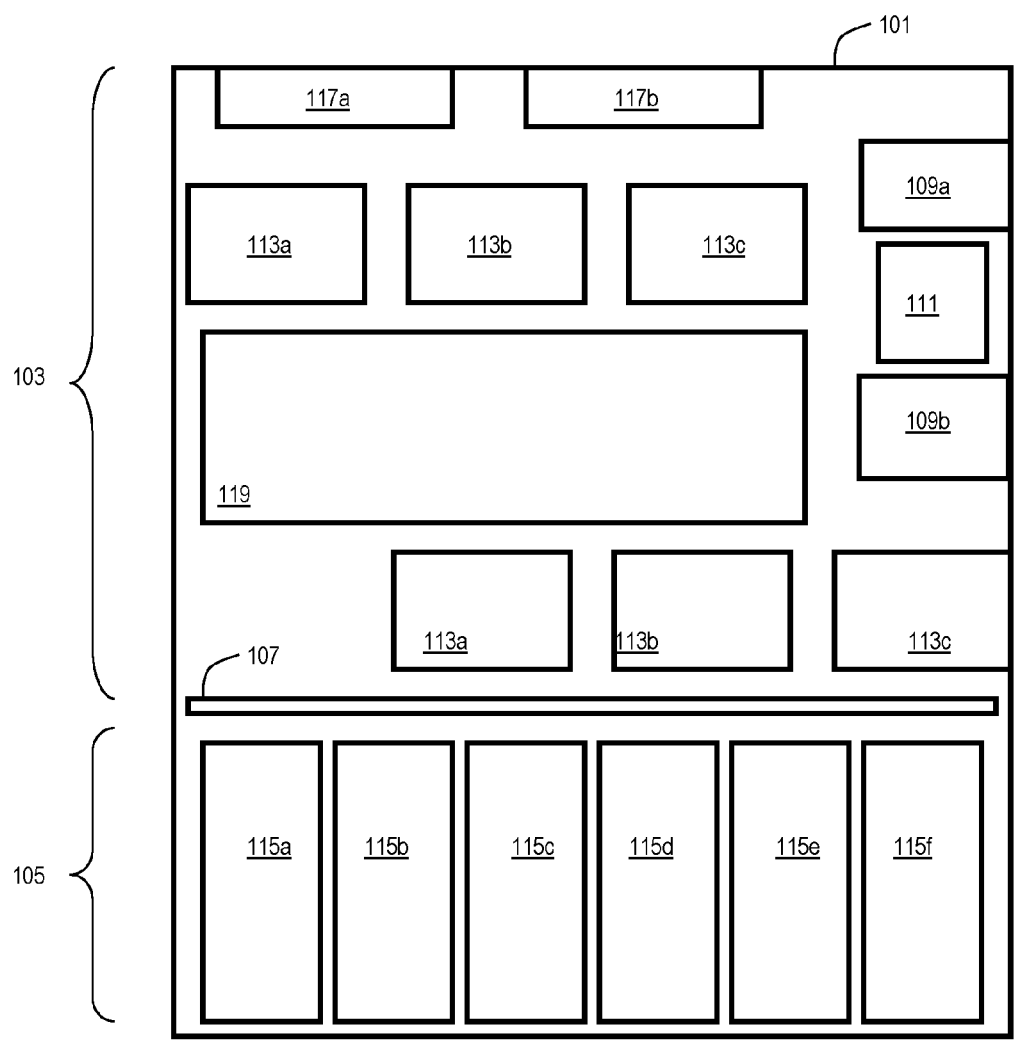
FIG. 1 is a top view of a shelf-mountable electronic assembly as known in the art.

The headings used herein are for organizational purposes only and are not meant to be used to limit the scope of the description or the claims. As used throughout this application, the word "may" is used in a permissive sense (i.e., meaning having the potential to), rather than the mandatory sense (i.e., meaning must). Similarly, the words "include", "including", and "includes" mean including but not limited to. To facilitate understanding, like reference numerals have been used, where possible, to designate like elements common to the figures. Optional portions of the figures may be illustrated using dashed or dotted lines, unless the context of usage indicates otherwise.

DETAILED DESCRIPTION

The exemplary apparatus and methods of this disclosure will also be described in relation to software, modules, and associated hardware. However, to avoid unnecessarily obscuring the present disclosure, the following description omits well-known structures, components, assemblies and devices that may be shown in block diagram form, are well known, or are otherwise summarized.

In the following detailed description, numerous specific details are set forth in order to provide a thorough understanding of embodiments or other examples described herein. In some instances, well-known methods, procedures, components, assemblies and circuits have not been described in detail, so as to not obscure the following description. Further, the examples disclosed are for exemplary purposes only and other examples may be employed in lieu of, or in combination with, the examples disclosed. It should also be noted the examples presented herein should not be construed as limiting of the scope of embodiments of the present disclosure, as other equally effective examples are possible and likely.

As used herein, the term "module" refers generally to a logical sequence or association of steps, processes, assemblies or components. For example, a software module may comprise a set of associated routines or subroutines within a computer program. Alternatively, a module may comprise a substantially self-contained hardware device. A module may also comprise a logical set of processes irrespective of any software or hardware implementation.

A module that performs a function also may be referred to as being configured to perform the function, e.g., a data module that receives data also may be described as being configured to receive data. Configuration to perform a function may include, for example: providing and executing computer code in a processor that performs the function; providing provisionable configuration parameters that control, limit, enable or disable capabilities of the module (e.g., setting a flag, setting permissions, setting threshold levels used at decision points, etc.); providing a physical connection, such as a jumper to select an option, or to enable/disable an option; attaching a physical communication link; enabling a wireless communication link; providing electrical circuitry that is designed to perform the function without use of a processor, such as by use of discrete components and/or non-CPU integrated circuits; energizing a circuit that performs the function (e.g., providing power to a transceiver circuit in order to receive data); and so forth.

As used herein, the term "transmitter" may generally comprise any device, circuit, or apparatus capable of transmitting a signal. As used herein, the term "receiver" may generally comprise any device, circuit, or apparatus capable of receiving a signal. As used herein, the term "transceiver" may generally comprise any device, circuit, or apparatus capable of transmitting and receiving a signal. As used herein, the term "signal" may include one or more of an electrical signal, a radio signal, an optical signal, an acoustic signal, and so forth.

Any combination of one or more computer readable medium(s) may be utilized. The computer readable medium may be a computer readable signal medium or a computer readable storage medium. A computer readable storage medium excludes a computer readable signal medium such as a propagating signal. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: a portable computer diskette, a hard disk, a random access memory (RAM), a read-only memory (ROM), an erasable programmable read-only memory (EPROM or Flash memory), a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device. Program code embodied on a computer readable medium may be transmitted using any appropriate medium, including but not limited to wireless, wireline, optical fiber cable, RF, etc., or any suitable combination of the foregoing.

FIG. 1 illustrates a simplified overhead view of a shelf-mountable electronic assembly 100 as known in the art. FIG. 1 has been simplified to omit harness wiring, in order to emphasis exemplary placement of electronic components and subsystems within assembly 100. Components and subsystems are not drawn to scale and are for illustration only. The numbers and placement of components and subsystems may vary. Assembly 100 includes an enclosure 101, which may be divided into several compartments, of which compartment 103 (toward the rear of enclosure 101) and compartment 105 (toward the front of enclosure 101) are illustrated. Compartments 103 and 105 may be divided by a vertically-mounted midplane circuit board 107, which extends horizontally across a substantial width of enclosure 101, and vertically across a substantial height of enclosure 101. Midplane circuit board 107 may provide electrical interconnections and/or mechanical support for a plurality of bays 115a . . . 115f (generically, bays 115) located in compartment 105. Bays 115 may be used to house subsystems such as disk drives, solid state drives, etc.

Compartment 103 may include a motherboard 119 and a plurality of subsystems 113a . . . 113e (generically, subsystem 113), which may include high-capacitance capacitor arrays. Some of subsystems 113 may be mounted directly to enclosure 101 or on standoffs to enclosure 101, rather than being mounted to a common circuit board such as motherboard 119. Compartment 103 further may include a power supply 109a and optionally a redundant power supply 109b. If a redundant power supply is provided, a circuit 111 may be provided to switch between power supplies 109 for fault tolerance purposes. Compartment 103 further may include fan 117a and optionally a second fan 117b. More than one fan may be provided for fault tolerance, additional cooling capacity, etc.

A motherboard (not illustrated in FIG. 1) may be provided within enclosure 101 as a circuit board mounted horizontally (i.e., parallel to the plane of FIG. 1). The motherboard may extend under at least some of subsystems and/or bays 115, and may include electrical connections to vertically-mounted midplane circuit board 107.

Figure 2:
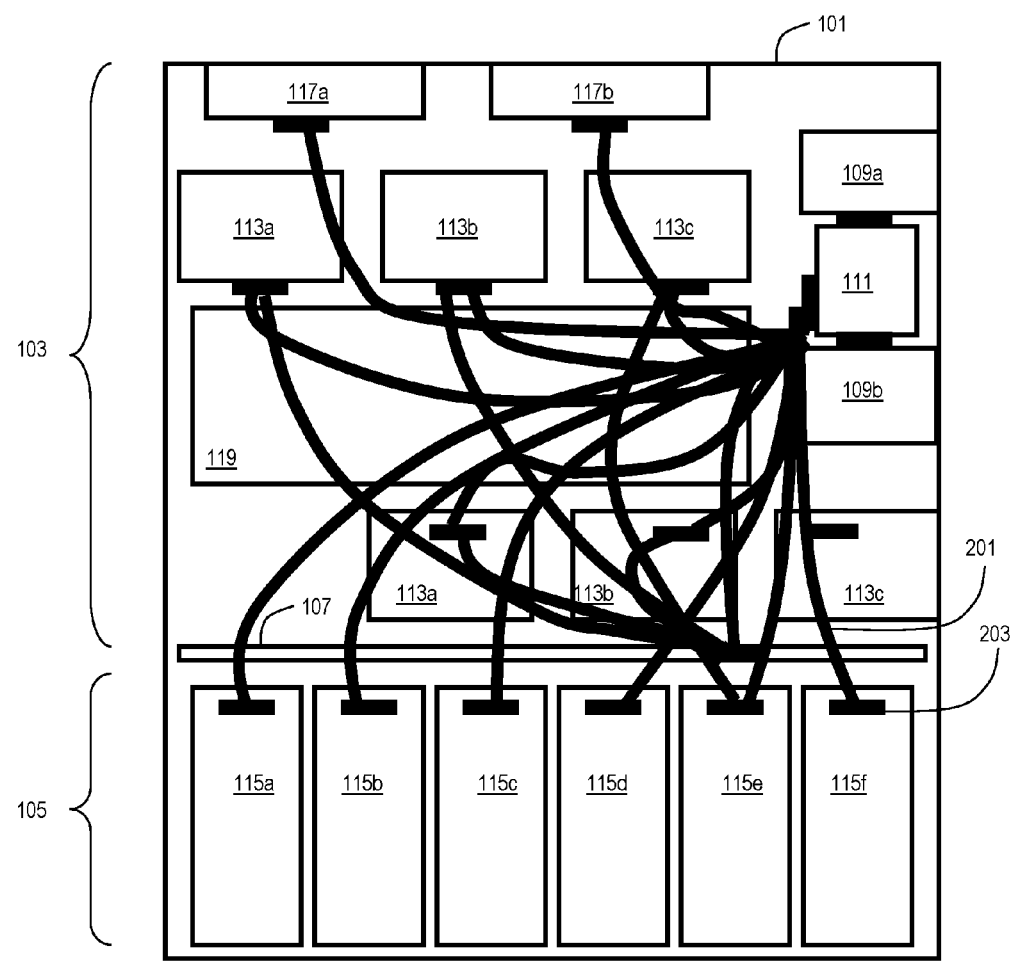
FIG. 2 is a top view of a shelf-mountable electronic assembly with cable harnesses as known in the art.

FIG. 2 illustrates a simplified overhead view of a shelf-mountable electronic assembly 100 as known in the art, illustrated as including exemplary wiring harnesses 201 (only one wiring harness 201 marked with a reference designator for sake of clarity). FIG. 2 is not drawn to scale. Each wiring harness 201 is a bundle of multiple wires, which may include standardized connectors 203 on both ends of harness 201 (only one connector 203 marked with a reference designator for sake of clarity). The connectors 203 mate with matching connector receptacles, e.g., on subsystems 113, bays 115, and so forth. Connectors 203 and connector receptacles may be for power (e.g., Molex™-style designs), or for digital signals such as clock, data, enable, etc. (e.g., ribbon cable connectors, zero insertion force (ZIF) style connectors, etc.). Placement and number of wiring harnesses 201 and connectors 203, as well as source and destination of wiring harnesses 201, are for illustration only.

As can be appreciated even from the simplified view of FIG. 2, wiring harnesses may take up significant volume within enclosure 101, and may complicate any post-manufacturing servicing within enclosure 101 (e.g., to add or replace a subsystem 113), because access is more difficult, the risk of misidentifying a harness is greater, there is greater risk of damaging or dislodging harnesses, etc. Furthermore, the volume and quantity of wiring impedes air flow and impedes efforts to further miniaturize the electronic components.

Figure 3:
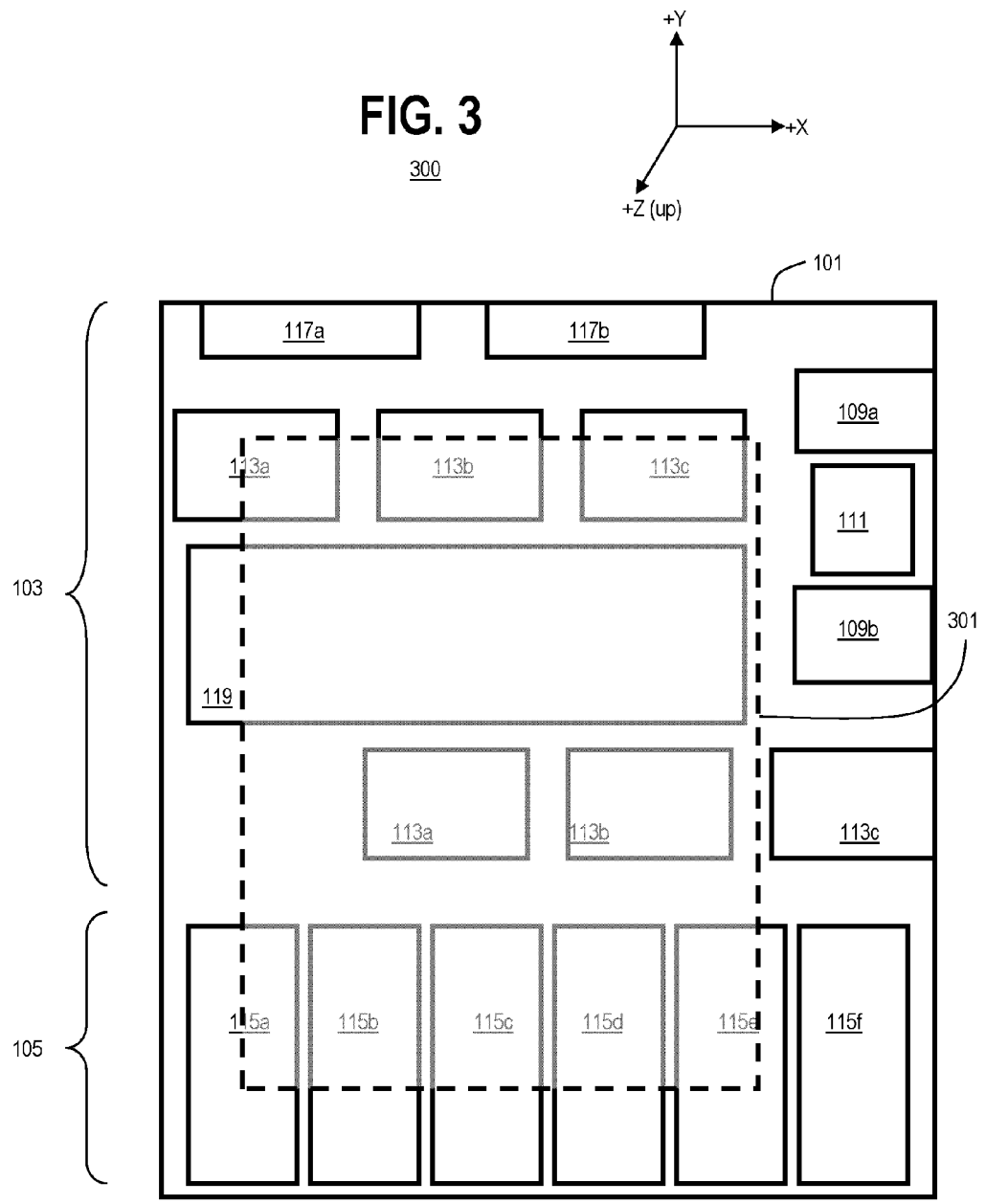
FIG. 3 is a top view of a shelf-mountable electronic assembly with a midplane conductor board in accordance with an embodiment of the present disclosure.

FIG. 3 illustrates a simplified overhead view of a shelf-mountable electronic assembly 300 in accordance with an embodiment of the present disclosure. The XYZ coordinates are as indicated in FIG. 3. FIG. 3 is not drawn to scale. Assembly 300 includes a midplane conductor panel 301, generally oriented to have a major surface parallel to the XY plane (i.e., a horizontal plane parallel with the plane of FIG. 3). The shape of midplane conductor panel 301 is for illustration only, and other shapes are usable, so long as midplane conductor panel 301 includes a portion of its surface relatively near to a substantial number of subsystems 113 and/or bays 115. Electrical connections are not illustrated in FIG. 3 for sake of clarity. Midplane conductor panel 301 is generally offset in the +Z-axis direction (i.e., above the plane of FIG. 3), above the components and subsystems shown and described in the context of FIG. 1. In the context of midplane conductor panel 301, "relatively near" in some embodiments may mean overlapping (or sharing) at least one of an X-axis or Y-axis position, with separation allowed in the Z-axis direction. In some embodiments, "a substantial number" may mean at least 50% of a total number of subsystems 113 and/or bays 115.

Midplane conductor panel 301 is oriented substantially parallel to the direction of air flow within electronic assembly 300. FIG. 3 illustrates in phantom the components and subsystems 113 beneath midplane conductor panel 301. Midplane conductor panel 301 may be mounted on standoffs or the like to elevate midplane conductor panel 301 above other components and subsystems 113 within electronic assembly 300. Midplane conductor panel 301 may cover a substantial portion in the X-Y plane of the footprint of electronic assembly 300. In some embodiments, the substantial portion may be at least 25%. In some embodiments, the substantial portion may be at least 33%. In some embodiments, the substantial portion may be at least 50%. In some embodiments, the substantial portion may be at least 75%.

Midplane conductor panel 301 includes one or more planar conductors, used to provide distribution of an electrical signal (e.g., a +Vcc DC power distribution, such as +5 volts DC, or +3.5 volts DC, or −12 volts DC, etc.) or to provide an electrical interconnection (e.g., a ground plane) to components within assembly 300, such as multiple subsystems 113, drives within bays 115, power supplies 109, fans 117, and so forth. Separate plane or portions of planes within midplane conductor panel 301 may be used as multiple planar conductors, thereby being able to distribute various power supply voltages in addition to electrical ground. By providing +Vcc and/or ground distribution by use of conductor planes within midplane conductor panel 301, the length of many wiring bundles within assembly 300 may be reduced, thereby freeing up interior space within assembly 300, improving maintainability and air flow. An additional benefit of using planar conductors is that the impedance of a planar conductor is lower for DC power distribution and ground potential, as compared to otherwise equivalent discrete inter-connection wiring.

In some embodiments, midplane conductor panel 301 further may include data line traces to ferry data signals among subsystems 113 and/or data bays 115 in a pass-through manner, without having to pass through the motherboard, and avoiding usage of a wire harness directly connecting the subsystems 113 and/or data bays 115. Data lines may be provided on a separate layer of midplane conductor panel 301, or may share a layer with a +Vcc or ground plane by use of a separate region of the shared plane. In some embodiments, midplane conductor panel 301 may be substantially passive, essentially without any active components except for optional status light emitting diode (LED) indicators. No active components refers to a lack of components that require electrical power to operate, such as integrated circuits (ICs). However, in some embodiments, passive or reactive components may be included, such as resistors, capacitors and inductors.

Optional status LED indicators are visually useful to indicate a status of an electrical interface in an electronic assembly, without a need to use a computerized machine-human monitoring interface. Placing such LEDs on midplane conductor panel 301 puts the indicator physically closer to a possible source of a problem (e.g., damaged connector, bad cable, etc.), thus facilitating troubleshooting when compared to placing LEDs on a front faceplate of the electronic assembly, and avoiding a need to bring status wiring to the front faceplate.

In some embodiments, midplane conductor panel 301 and in particular a ground plane thereon may provide electromagnetic (EM) shielding, i.e., a reduction in EM radiation or EM susceptibility.

A highly-integrated electronic assembly of the background art may be implemented substantially entirely on a single main circuit board (e.g., a motherboard). However, due to footprint limitations or a desire to make some parts of a design replaceable or more manufacturable, some electronic assemblies may include a daughterboard, also known as a mezzanine board. Such daughterboards may include integrated circuits (ICs) and electronic components that cannot fit on the main circuit board, or are not desired on the main circuit board. Furthermore, such daughterboards commonly either act upon signals received from the main circuit board (e.g., by performing a processing function greater than merely generating a status display), or generate signals sent to the main circuit board. Such daughterboards generally do not merely pass along signals received from the main circuit board on one part of the daughterboard to another part of the daughterboard for transmission back to the main circuit board, without processing of the signals. In contrast, some embodiments in accordance with the present disclosure do not generate signals and do not act upon signals passing through connector board 301, other than a de minimus operation such as generating an LED indication.

Figure 4:
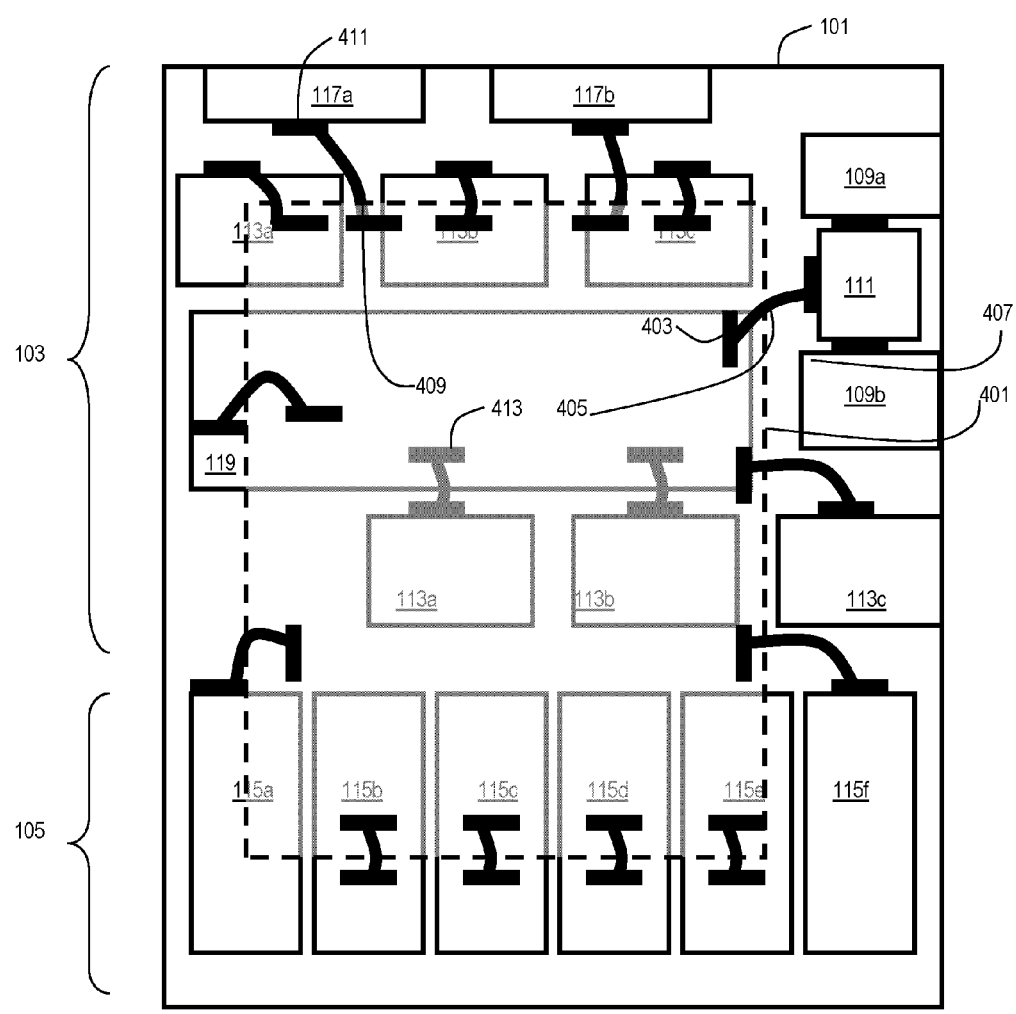
FIG. 4 is a top view of a shelf-mountable electronic assembly with a midplane conductor board and reduced wiring harnesses in accordance with an embodiment of the present disclosure.

FIG. 4 illustrates a simplified overhead view of a shelf-mountable electronic assembly 400 in accordance with an embodiment of the present disclosure. The XYZ coordinates are as indicated in FIG. 4. FIG. 4 is not drawn to scale. Electronic assembly 400 includes midplane conductor panel 401. The shape of midplane conductor panel 401 is for illustration only, and other shapes are usable, so long as midplane conductor panel 401 includes a portion of its surface relatively near to a substantial number of subsystems 113 and/or bays 115.

Midplane conductor panel 401 may include one or more planar conductors, each of which covers a substantial portion of an X-Y plane cross-section of midplane conductor panel 401. Such planar conductors may be used for a ground plane and/or a +Vcc plane. A plane may be shared by more than one planar conductor if the planar conductors are physically and electrically separated from each other on the plane. Midplane conductor panel 401 may include connectors such as connector 403 that connects a ground plane (and/or +Vcc plane) via cable 405 to a connector (e.g., connector 407) which may function as an electrical ground reference or may supply +Vcc. Cable 405 and similar cables in FIG. 4 also may be known as a "wire to board", i.e., a cable that joins together two independent circuit boards, or joins a circuit board to an electronic subsystems 113 or bay 115. Midplane conductor panel 401 further may include other connectors (e.g., connector 409) which may be used to supply electrical ground or +Vcc to electrical components in assembly 400, such as to fan 117a via connector 411. For sake of clarity, not all connectors are illustrated or labeled in FIG. 4.

Some connectors such as connectors 403, 409 may be provided on a top major surface of midplane conductor panel 401 (i.e., in the +Z direction), e.g., if improved access to the connector is desired. Some connectors such as connector 413 may be provided on a lower major surface of midplane conductor panel 401 (i.e., in the −Z direction), e.g., if constrained by harness routing or length limits. Some connectors may be provided on an edge of midplane conductor panel 401.

Midplane conductor panel 401 further may include connectors and related conductors to connect in a point-to-point manner from one connector to another, e.g., to ferry data signals from one subunit to another subunit. Connectors used for this purpose may be separate from connectors used to supply electrical ground and/or +Vcc (e.g., connector 409 described above) or may be integrated into the connectors. By ferrying data signals between subsystems or bays via midplane conductor panel 401 (e.g., between subsystem 113a and bay 115O), a dedicated wiring harness may be eliminated that would otherwise run between subsystem 113a and bay 115f, and in its place there are two relatively short wiring harnesses between subsystem 113a and midplane conductor panel 401, and between midplane conductor panel 401 and bay 115f. The mass of wiring harnesses within electronic assembly 400 is reduced, facilitating air flow.

Figure 5:
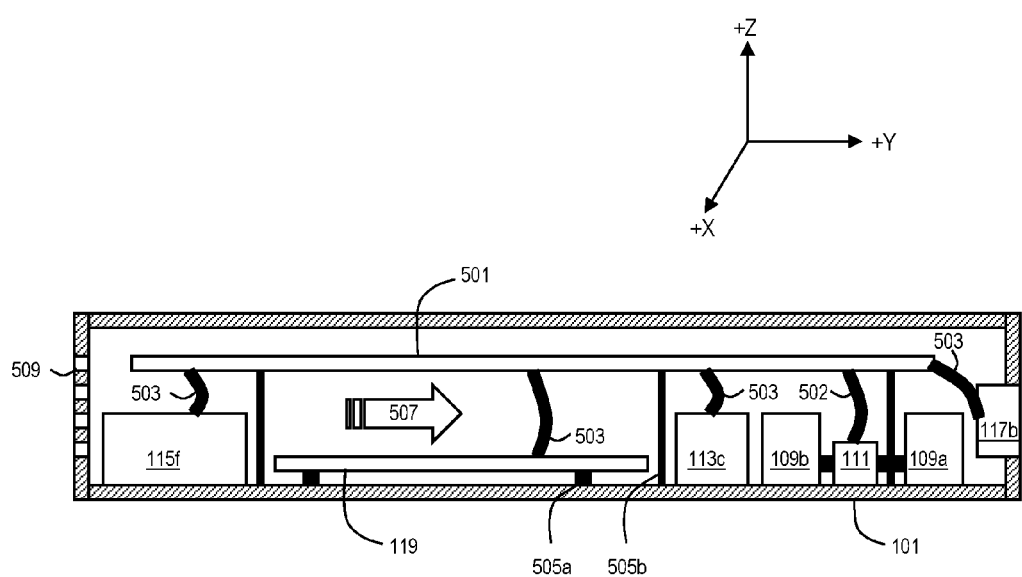
FIG. 5 is a side view of a shelf-mountable electronic assembly with a midplane conductor board and reduced wiring harnesses in accordance with an embodiment of the present disclosure.

FIG. 5 illustrates a simplified side view of a shelf-mountable electronic assembly 500 in accordance with an embodiment of the present disclosure. Items described with respect to earlier figures are marked with like reference numbers. The plane of FIG. 5 is parallel to the Y-Z plane. Assembly 500 includes a midplane conductor panel 501, elevated above subsystems 113 and bays 115 by use of supports 505b (e.g., standoffs), only one of which is marked for sake of clarity. Circuit 111 is coupled to midplane conductor panel 501 via harness 502 in order to supply +Vcc and/or a ground potential reference. In turn, midplane conductor panel 501 distributes +Vcc and/or the ground potential reference to various subsystems 113 and bays 115 by use of wire to board harnesses 503.

FIG. 5 further illustrates motherboard 119 elevated above lower side of enclosure 101 by use of supports 505a (e.g., standoffs), only one of which is marked for sake of clarity. FIG. 5 illustrates improved air flow 507, which is facilitated by use of midplane conductor panel 501. For example, air flow 507 may flow relatively freely from inlets 509, through enclosure 101, and pushed out the back by fan 117b. Improved air flow 507 allows for more effective cooling and/or usage of a smaller fan 117 to achieve similar cooling effectiveness, as compared to the design of FIG. 2.

Figure 6:
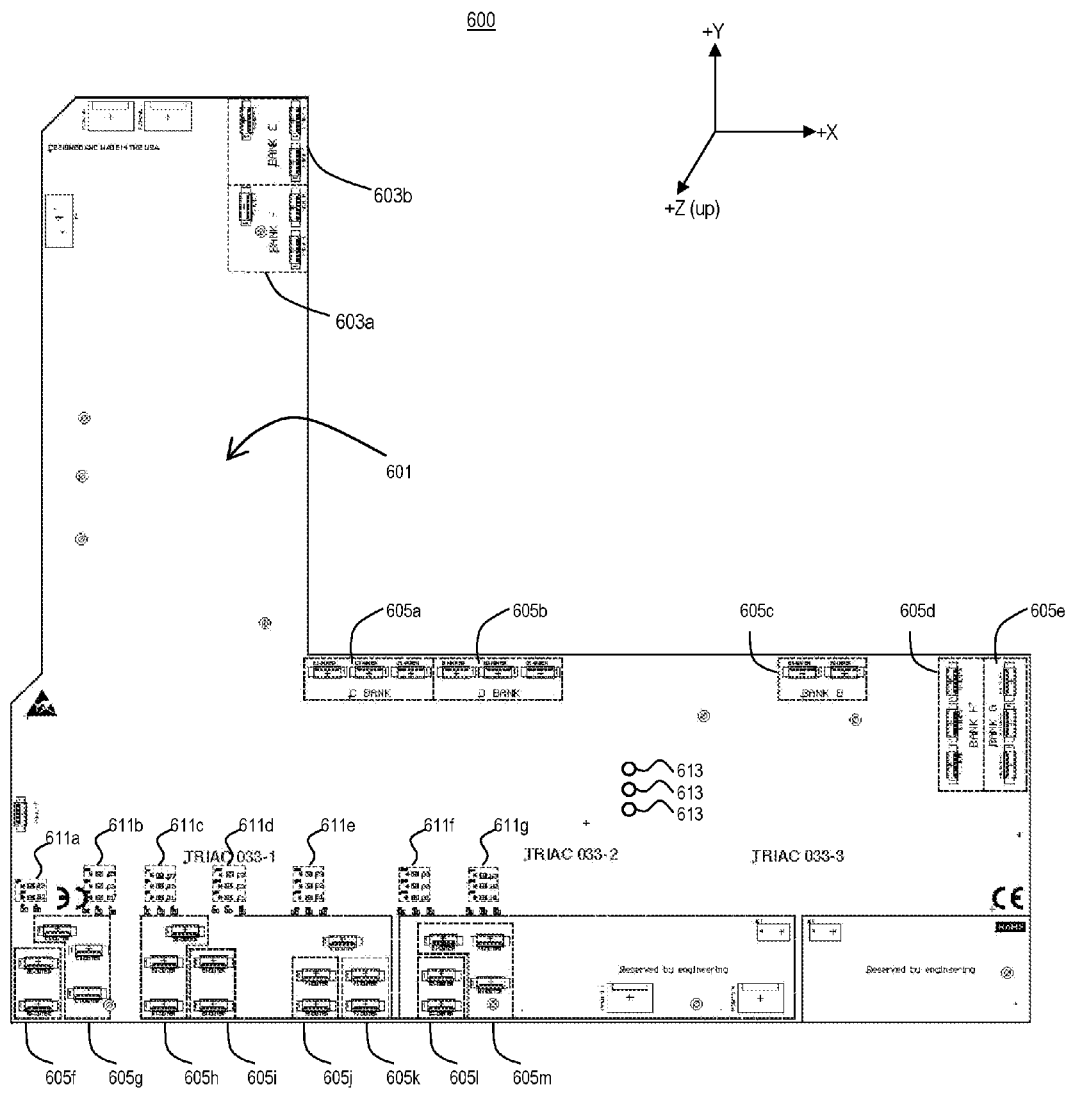
FIG. 6 is a top view of another embodiment of a midplane conductor board in accordance with an embodiment of the present disclosure.

FIG. 6 illustrates a midplane conductor panel 600 in accordance with an embodiment of the present disclosure. Conductor panel 600 viewed from above is approximately L-shaped, and includes a major surface 601. Parallel to major surface 601, either on an outer surface of conductor panel 600 or within the interior of conductor panel 600, there are one or more conductive planes that distribute +Vcc and/or electrical ground potential.

Conductor panel 600 further includes connector banks (i.e., groups of connectors) 603a-603b and banks 605a-605m (generically, bank, banks 603, or banks 605). Each connector bank in turn includes several connectors. Connectors in each bank are related, e.g., they connect to a single subsystem 113 or bay 115, or they connect to related subsystems 113 and/or bays 115. Banks 603 preferentially may connect to subsystems 113 and/or bays 115 toward a rear of electronic assembly 500 (e.g., in compartment 103). Banks 605 preferentially may connect to subsystems 113 and/or bays 115 toward a front of electronic assembly 500 (e.g., in compartment 105).

Conductor panel 600 also may include additional planar conductors to ferry signals between connectors and/or between banks. Such additional planar conductors may be provided as additional layers of a multilayer conductor panel 600, or as separate portions of a layer shared with the +Vcc and/or ground planes.

Some embodiments of conductor panel 600 further may include optional status indicators 611a. 611g (generically, indicators 611). These may be, e.g., LEDs that indicate conditions such as link activity, a fault condition, high speed voltage loss detection and power re-routing, charge status of the high-capacitance capacitor arrays, down stream power from the high-capacitance capacitor arrays to the non-volatile RAM (NVRAM) during power failure, activity on the wire-to-board interfaces, network interface activity or failure, fan 117 failure indicator, system power indicator, and so forth. In some embodiments, one or more indicators 611 may be associated with a connector bank 605.

These indicators 611 are helpful to show quickly to an operator the health of both directions of data transmission, and helps quickly troubleshoot if a connection is bad or malfunctioning, if an NVRAM module is bad or malfunctioning or if the high-capacitance capacitor array is bad or malfunctioning. Placing these indicators 611 on conductor panel 600 also improves visibility as compared to having indicators located on subsystems 113 or bays 115, without unduly cluttering the appearance of the electronic assembly if indicators 611 were brought to an exterior surface.

Some embodiments of conductor panel 600 further may include optional controls 613. Controls 613 may include service controls to power on or off the full system via tactile button and a reset full system tactile button.

Some embodiments of conductor panel 600 further may include optional active components in addition to pass-through signal traces. For example, such active components may include an embedded bootstrap memory device to store the operating system, embedded raid on chip (RoC) for high availability and mirror protection of boot strap devices, memory (e.g., 480 GB NAND) to store the operating system, a programmable ASIC for real time thermal monitoring, ASIC forced reset and power off during an unexpected or unwanted chassis intrusion, and so forth.

Some embodiments of conductor panel 600 further may include miscellaneous components such as embedded mini-PCI/e slots, alternate power methods (e.g., conductor panel 600 includes all super capacitors needed to power the NVRAM), exploring alternate power methods 'e.g'., batteries to remove super capacitors for certain industries when needed.

While the foregoing is directed to embodiments of the present disclosure, other and further embodiments of the present disclosure may be devised without departing from the basic scope thereof. It is understood that various embodiments described herein may be utilized in combination with any other embodiment described, without departing from the scope contained herein. Further, the foregoing description is not intended to be exhaustive or to limit the disclosure to the precise form disclosed. Modifications and variations are possible in light of the above teachings or may be acquired from practice of the disclosure. Certain exemplary embodiments may be identified by use of an open-ended list that includes wording to indicate that the list items are representative of the embodiments and that the list is not intended to represent a closed list exclusive of further embodiments. Such wording may include "e.g.," "etc.," "such as," "for example," "and so forth," "and the like," etc., and other wording as will be apparent from the surrounding context.

No element, act, or instruction used in the description of the present application should be construed as critical or essential to the disclosure unless explicitly described as such. Also, as used herein, the article "a" is intended to include one or more items. Where only one item is intended, the term "one" or similar language is used. Further, the terms "any of" followed by a listing of a plurality of items and/or a plurality of categories of items, as used herein, are intended to include "any of," "any combination of," "any multiple of," and/or "any combination of multiples of" the items and/or the categories of items, individually or in conjunction with other items and/or other categories of items.

Moreover, the claims should not be read as limited to the described order or elements unless stated to that effect. In addition, use of the term "means" in any claim is intended to invoke 35 U.S.C. §112(f), and any claim without the word "means" is not so intended.

I claim:

1. A connector board for an electronic assembly, the connector board comprising:
    a passive circuit board, mounted horizontally at an elevated position within the electronic assembly, wherein the passive circuit board is further mounted within the electronic assembly parallel to a direction of air flow within the electronic assembly;
    a voltage distribution plane formed as a layer of the passive circuit board;
    a first electrical interface coupled to the voltage distribution plane, the first electrical interface used to supply a predetermined voltage to the voltage distribution plane; and
    a second electrical interface coupled to the voltage distribution plane, the second electrical interface used to draw the predetermined voltage from the voltage distribution plane.

2. The connector board of claim 1, further comprising a ground plane formed as a layer of the passive circuit board.

3. The connector board of claim 2, further comprising:
    a first electrical interface coupled to the ground plane, the first electrical interface used to establish an electrical ground reference to the ground plane; and
    a second electrical interface coupled to the ground plane, the second electrical interface used to supply the electrical ground voltage to an electronic component not on the connector board.

4. The connector board of claim 1, wherein the passive circuit board does not include any active components mounted to the passive circuit board.

5. The connector board of claim 1, further comprising:
    a first data interface coupled to the connector board, the first data interface used to provide a data signal to the connector board;
    a second data interface coupled to the connector board, the second data interface used to read the data signal from the connector board; and
    a data trace formed within a plane of the connector board, the data trace electrically coupling the first data interface to the second data interface.

6. The connector board of claim 5, further comprising a light emitting diode (LED) coupled to the connector board, the LED electrically coupled to display an activity indicator of the data trace.

7. The connector board of claim 1, wherein the passive circuit board overlays a majority of electronic components within the electronic assembly.

8. The connector board of claim 1, wherein the passive circuit board is mounted on standoffs within the electronic assembly.

9. The connector board of claim 1, wherein the passive circuit board provides electromagnetic (EM) shielding for electronic components within the electronic assembly.

10. The connector board of claim 1, further comprising a connector coupled to the passive circuit board, to provide a wire to board interface to a motherboard.

11. The connector board of claim 1, wherein the elevated position within the electronic assembly comprises a position higher than electronic components within the electronic assembly.

12. The connector board of claim 1, wherein the predetermined voltage comprises 5 volts DC.

13. A method to provide distribution of a predetermined voltage potential within an electronic assembly, the method comprising steps of:
- mounting a passive circuit board horizontally at an elevated position within the electronic assembly, wherein a voltage distribution plane is formed as a layer of the passive circuit board, and wherein the passive circuit board is further mounted within the electronic assembly parallel to a direction of air flow within the electronic assembly;
- coupling a first electrical interface to the voltage distribution plane, the first electrical interface used to supply a predetermined voltage to the voltage distribution plane; and
- coupling a second electrical interface to the voltage distribution plane, the second electrical interface used to draw the predetermined voltage from the voltage distribution plane.

\* \* \* \* \*

UNITED STATES PATENT AND TRADEMARK OFFICE
CERTIFICATE OF CORRECTION

PATENT NO. : 9,603,251 B1
APPLICATION NO. : 15/089053
DATED : March 21, 2017
INVENTOR(S) : Ignomirello It is certified that error appears in the above-identified patent and that said Letters Patent is hereby corrected as shown below:

In the Specification

In Column 8, Line 59, delete "611a. 611g" and insert -- 611a... 611g --, therefor.

In Column 8, Line 63, delete "down stream" and insert -- downstream --, therefor.

In Column 9, Line 32, delete "'e.g'.," and insert -- e.g., --, therefor.

Signed and Sealed this
Thirtieth Day of May, 2017

Michelle K. Lee
*Director of the United States Patent and Trademark Office*